(12) United States Patent
Yoshioka et al.

(10) Patent No.: US 8,252,132 B2
(45) Date of Patent: Aug. 28, 2012

(54) METHOD AND APPARATUS FOR REPAIRING AN ELECTROSTATIC CHUCK DEVICE, AND THE ELECTROSTATIC CHUCK DEVICE

(75) Inventors: Ken Yoshioka, Shizuoka (JP); Syuichi Takahashi, Matsushima-machi (JP); Yasuharu Sasaki, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 411 days.

(21) Appl. No.: 12/686,759

(22) Filed: Jan. 13, 2010

(65) Prior Publication Data
US 2010/0177455 A1   Jul. 15, 2010

Related U.S. Application Data

(60) Provisional application No. 61/221,106, filed on Jun. 29, 2009.

(30) Foreign Application Priority Data

Jan. 14, 2009 (JP) ................................. 2009-005611

(51) Int. Cl.
*B32B 37/00* (2006.01)
(52) U.S. Cl. ............. 156/94; 156/98; 156/169; 156/172
(58) Field of Classification Search .................... 156/94, 156/98, 169, 172
See application file for complete search history.

(56) References Cited

FOREIGN PATENT DOCUMENTS

| CN | 1698192 A | 11/2005 |
|---|---|---|
| JP | 2000-114358 | 4/2000 |
| JP | 2008-28052 A * | 2/2008 |

OTHER PUBLICATIONS

Office Action issued Sep. 13, 2011, in Chinese Patent Application No. 201010003196.1 with English translation.

* cited by examiner

*Primary Examiner* — Jeff Aftergut
(74) *Attorney, Agent, or Firm* — Oblon, Spivak, McClelland, Maier & Neustadt, L.L.P.

(57) ABSTRACT

In a repairing method for an electrostatic chuck device in which at least an adhesive layer and an attracting layer are provided on a metal base, a side surface of an eroded adhesive layer is wound with a string-like adhesive and thermal compression is performed thereafter. A repairing apparatus for an electrostatic chuck device, which is used in the repairing method, includes a rotatable table for rotating the electrostatic chuck device and a bobbin for supplying the adhesive to the adhesive layer.

9 Claims, 3 Drawing Sheets

METHOD AND APPARATUS FOR REPAIRING AN ELECTROSTATIC CHUCK DEVICE, AND THE ELECTROSTATIC CHUCK DEVICE

CROSS-REFERENCE TO RELATED APPLICATIONS

This application claims priority to Japanese Patent Application No. 2009-005611 filed on Jan. 14, 2009, the entire contents of which are incorporated herein by reference.

FIELD OF THE INVENTION

The present invention relates to a method and an apparatus for repairing an electrostatic chuck device, and the electrostatic chuck device.

BACKGROUND OF THE INVENTION

In an industrial field for manufacturing an IC chip or the like, a chuck device for holding a semiconductor wafer in a predetermined portion of a processing device is widely used in a semiconductor wafer process. The chuck device may be a mechanical chuck device, a vacuum chuck device or an electrostatic chuck device. The electrostatic chuck device is advantageous especially to reliably attract and fix an uneven semiconductor wafer, and also, the electrostatic chuck device is easy to handle and use even in a vacuum state.

The electrostatic chuck device attracts an object to be attracted such as a wafer or the like by static electricity generated by applying a voltage to an internal electrode embedded in an insulating member. Further, the wafer is processed by, e.g., plasma etching in a state where temperature of the wafer is controlled to be maintained at a desired level by heating an attracting surface (chuck surface) by a heater built in the chuck. A ceramic plate is widely used for an attracting layer forming the wafer attracting surface because of its high resistance to the plasma etching and long life span.

As for the electrostatic chuck device, there is widely used one having a structure in which a metal base and a ceramic plate are adhered to each other by an adhesive. However, in this electrostatic chuck device, an exposed side surface of an adhesive layer between the metal base and the ceramic plate is eroded by the side etching of the plasma during the processing of the wafer. If an outer peripheral portion of the adhesive layer is eroded, thermal conductivity between the ceramic plate and the metal base at the outer peripheral of the ceramic plate becomes different from that at the central portion of the ceramic plate. Therefore, it is difficult to uniformly dissipate heat of the wafer, which is brought to a high temperature by the etching, through the metal base via the ceramic plate and the adhesive layer. This leads to a temperature deviation on the wafer, and desired etching cannot be performed due to the bending of the wafer.

As for the electrostatic chuck device for suppressing erosion of the side surface of the adhesive layer, there is proposed an electrostatic chuck device in which an erosion preventing insulating material is provided at the side surface of the adhesive layer (Japanese Patent Application Publication NO. 2000-114358).

However, the electrostatic chuck device disclosed in Japanese Patent Application Publication NO. 2000-114358 may not sufficiently suppress the erosion of the adhesive layer by the plasma.

When the adhesive layer is eroded, it may be necessary to repair the adhesive layer by applying a liquid adhesive dissolved in a solvent to the eroded portion and performing thermal compression. In this method, however, voids are generated in the repaired portion of the adhesive layer due to evaporation of the solvent. Since the adhesive layer becomes non-uniform, the thermal conductivity of the repaired adhesive layer becomes non-uniform. Accordingly, when the adhesive layer is eroded, the adhesive layer and the ceramic plate are discarded and replaced even if the ceramic plate is still usable.

As described above, when the adhesive layer deteriorates, the ceramic plate has to be replaced regardless of its good durability and long life span and, hence, the characteristics of the ceramic plate cannot be sufficiently utilized. Therefore, it is required to reduce a maintenance cost by preventing replacement of the high-priced ceramic plate while maintaining performance of the electrostatic chuck device by uniformly repairing the eroded side surface of the adhesive layer.

SUMMARY OF THE INVENTION

In view of the above, the present invention provides a repairing method and apparatus capable of uniformly repairing an eroded side surface of an adhesive layer in an electrostatic chuck device, and an electrostatic chuck device to which the repairing method and the repairing apparatus are applied.

In accordance with an aspect of the present invention, there is provided a repairing method for an electrostatic chuck device in which at least an adhesive layer and an attracting layer are provided on a metal base, wherein a side surface of an eroded adhesive layer is wound with a string-like adhesive and thermal compression is performed thereafter.

Further, the string-like adhesive may be made of a material same as a material of the adhesive layer.

Further, the adhesive layer and the string-like adhesive may contain acrylic rubber and thermosetting resin.

Further, the string-like adhesive may have a rectangular cross section.

Further, a height of the string-like adhesive may be about 1 to 2 times greater than a height of the adhesive layer.

Further, the thermal compression may be performed under the condition of about 0.02 to 0.5 MPa.

In accordance with another aspect of the present invention, there is provided a repairing apparatus for an electrostatic chuck device which is used in the repairing method described above, including a rotatable table for rotating the electrostatic chuck device and a bobbin for supplying the adhesive to the adhesive layer.

The repairing apparatus for an electrostatic chuck device described above further includes a positioning device for positioning the adhesive between the bobbin and the adhesive layer.

In accordance with still another aspect of the present invention, there is provided an electrostatic chuck device in which at least an adhesive layer and an attracting layer are provided on a metal base, wherein a side surface of the adhesive layer is wound with a string-like adhesive.

In accordance with the repairing method of the present invention, even if the side surface of the adhesive layer of the electrostatic chuck device is eroded, the eroded portion can be uniformly repaired. Further, in accordance with the repairing apparatus of the present invention, when the side surface of the adhesive layer of the electrostatic chuck device is eroded, the eroded portion can be easily and uniformly repaired. Furthermore, the present invention can provide an electrostatic chuck device to which the repairing method and the repairing apparatus are applied.

BRIEF DESCRIPTION OF THE DRAWINGS

The objects and features of the present invention will become apparent from the following description of embodiments, given in conjunction with the accompanying drawings, in which.

DETAILED DESCRIPTION OF EMBODIMENT

Hereinafter, an embodiment of the present invention will be described with reference to the accompanying drawings which form a part hereof.
[Repairing Apparatus]

A repairing apparatus for an electrostatic chuck device in accordance with the present invention is used to repair an eroded side surface of an adhesive layer of the electrostatic chuck device. There is no particular limitation on the electrostatic chuck device to which the repairing apparatus in accordance with the present invention is applied as long as it has a structure in which at least an adhesive layer and an attracting layer are provided on a metal base.

Figure 1:
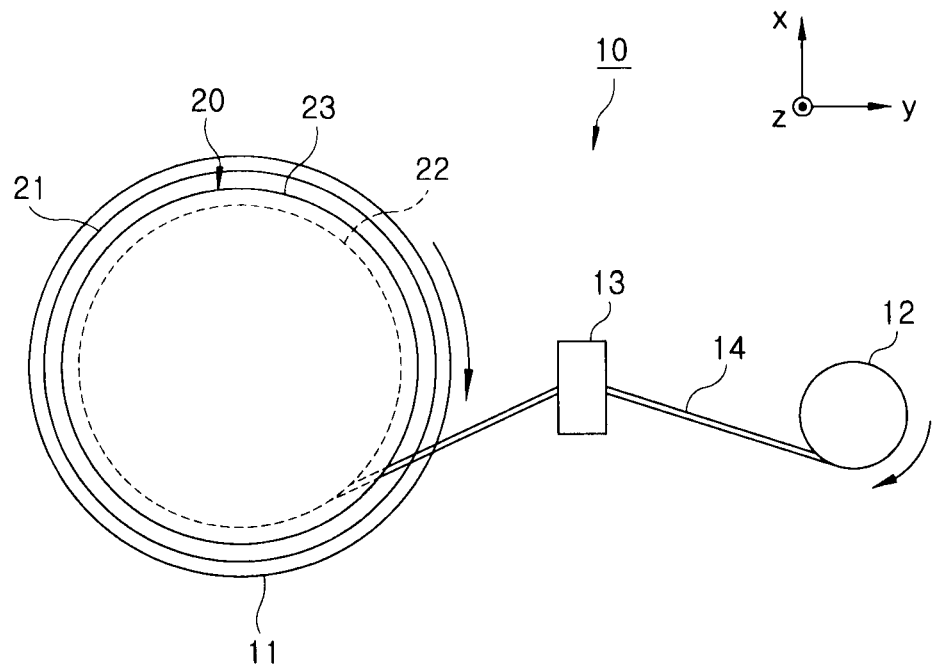
FIG. 1 is a top view schematically showing an example of a repairing apparatus in accordance with an embodiment of the present invention.
Figure 2:
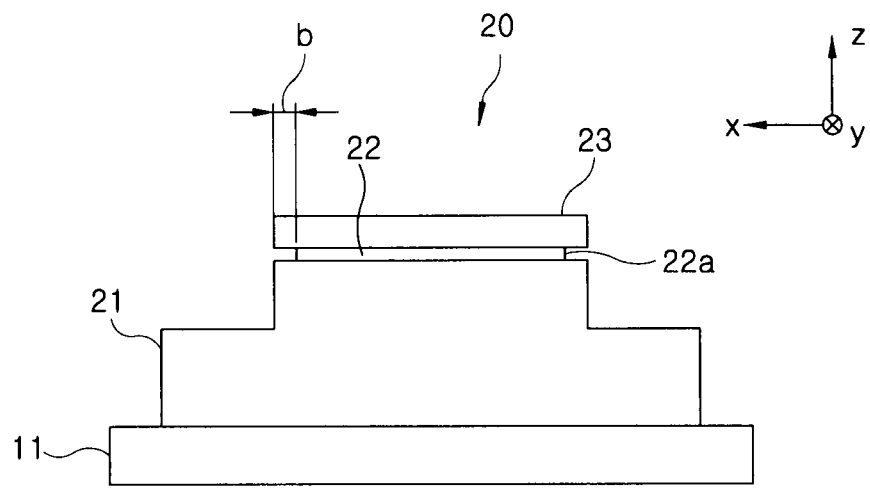
FIG. 2 describes a front view of a rotatable table and an electrostatic chuck device shown in FIG. 1.

Hereinafter, an example of the repairing apparatus in accordance with an embodiment of the present invention will be described in detail. FIG. 1 is a top view showing a state where an electrostatic chuck device 20 (shown in FIG. 4) is repaired by using a repairing apparatus 10 of the present embodiment; and FIG. 2 is a front view of the electrostatic chuck device 20.

Figure 4:
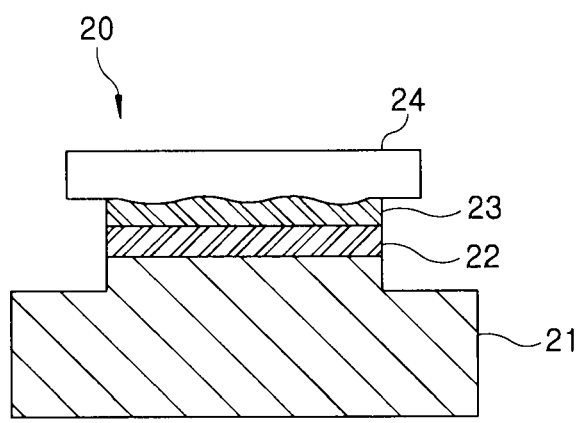
FIG. 4 shows a cross sectional view illustrating an example of the electrostatic chuck device in accordance with the embodiment of the present invention.

As shown in FIG. 4, the electrostatic chuck device 20 has a well-known structure in which a metal base 21 and an attracting layer 23 made of ceramic or insulating resin sheet having therein an electrode are adhered to each other by an adhesive layer 22. A wafer 24 is attracted to and held on a top surface of the attracting layer 23.

As illustrated in FIG. 1, the repairing apparatus 10 of the present embodiment includes a rotatable table 11 for rotating the electrostatic chuck device 20; a bobbin 12 for supplying an elastic string-like adhesive 14 (hereinafter, simply referred to as an "adhesive 14") to the adhesive layer 22 of the electrostatic chuck device 20; and a positioning device 13 for positioning the adhesive 14 between the bobbin 12 and the adhesive layer 22.

Figure 3:
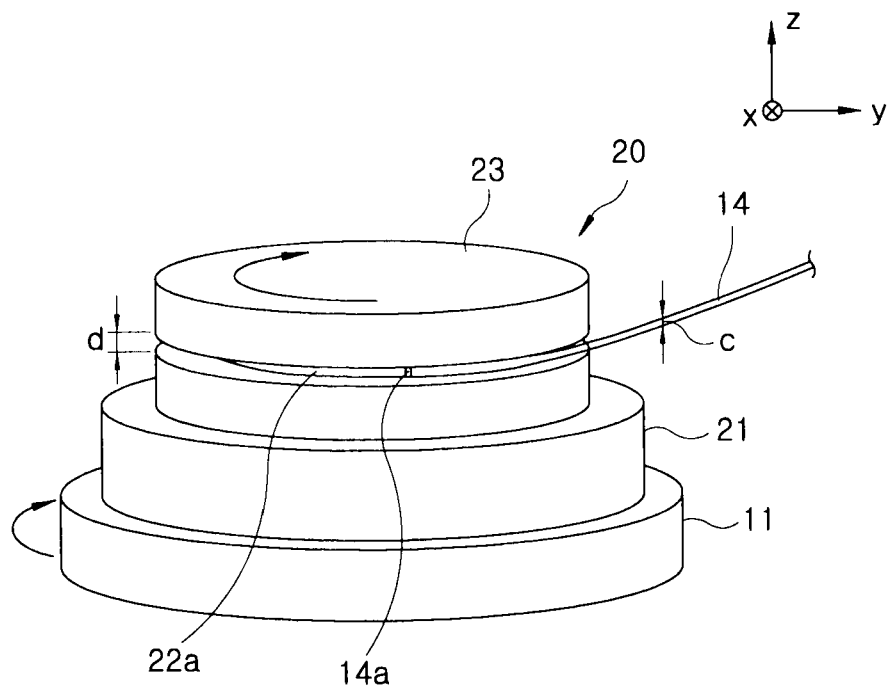
FIG. 3 provides a perspective view of the rotatable table and the electrostatic chuck device shown FIG. 1.

There is no particular limitation on the shape or the size of the rotatable table 11 as long as it can mount thereon the electrostatic chuck device 20 and stably rotate the electrostatic chuck device 20 at a desired speed. The rotatable table 11 in this example is larger than the metal base 21 of the electrostatic chuck device 20 and has a disc shape, as shown in FIGS. 2 and 3. By rotating the rotatable table 11, the electrostatic chuck device 20 mounted thereon can be rotated at a desired speed.

The rotatable table 11 may be rotated manually by using a handle or the like or by using a control unit for controlling start and stop of rotation, rotational speed and the like.

The bobbin 12 supplies the adhesive 14 to an eroded side surface 22a (shown in FIG. 3) of the adhesive layer 22. The adhesive 14 is wound around the bobbin 12. There is no particular limitation on the bobbin 12 as long as a string-like material can be wound thereto and it can be a conventional bobbin that uses a string-like material wound thereto.

The adhesive 14 has a string shape and is preferably made of a material same as that of an adhesive forming the adhesive layer 22 to be repaired. The adhesive layer 22 is repaired by the adhesive 14 made of a material same as that of the adhesive forming the adhesive layer 22 to be repaired, and thus, the uniform adhesive layer 22 can be easily obtained. Further, it is possible to prevent a temperature deviation on the wafer or bending of the attracting layer 23 which is caused by a non-uniform thermal conductivity of the adhesive layer 22.

The adhesive 14 and the adhesive used for the adhesive layer 22 are preferably made of a material same as that used for the adhesive layer of the electrostatic chuck device. It is further preferable that this material contains acrylic rubber and thermosetting resin. The adhesive containing acrylic rubber and thermosetting resin is effective in reducing erosion by a plasma.

The acrylic rubber is a polymer of alkyl (meth)acrylate ester or a copolymer obtained by copolymerizing alkyl (meth)acrylate ester as a main component and a second component having an active group. Among them, alkyl (meth)acrylate ester includes ethyl (meth)acrylate, propyl (meth)acrylate, butyl (meth)acrylate, methoxyethyl (meth)acrylate, ethoxyethyl (meth)acrylate or the like. These may be used alone, or at least two of these may be used in combination.

In addition, examples of the second component having an active group include, e.g., dicyclopentadiene, ethylidenenorbornene, vinyl chloroacetate, allyl chloroacetate, 2-chloroethyl vinyl ether, vinyl acrylate, allyl methacrylate, glycidyl methacrylate, dimethyl styryl vinylsilane, dicyclopentenyl acrylate, dicyclopentenyl oxyethyl acrylate, alkyl glycidyl ether, vinyl glycidyl ether, 2-chloroethyl acrylate, vinyl monochloroacetate, vinyl norbornene, acrylic acid, methacrylic acid, itaconic acid or the like. These may be used alone, or at least two of these may be used in combination. The amount of the second component having the active group is preferably smaller than or equal to about 15 weight % and more preferably smaller than or equal to about 10 weight % based on the weight of alkyl (meth)acrylate ester.

Furthermore, the acrylic rubber may contain as a third component a monomer such as acrylonitrile, styrene, 1,3-butadiene, isoprene, chloroprene, ethylene, propylene, vinyl acetate or the like. These may be used alone, or at least two of these may be used in combination. The content of the third element in the adhesive is preferably less than or equal to about 40 weight %.

A copolymerization method of acrylic rubber of the present invention is not particularly limited, and a conventional method can be used. However, in order to perform polymerization of a weight average molecular weight greater than or equal to about 1 million, a solution polymerization method is not suitable, and a method using an emulsifying such as an emulsion polymerization method, a pearl polymerization method or the like is generally used. The acrylic rubber may be used in a powder state or dissolved in an organic solvent. A commercial acrylic rubber includes Nipol Rubber manufactured by ZEON Co., Ltd., Teisan Rubber produced by Nagase ChemteX Co., Ltd., Toa Acron manufactured by Tohpe Co. Ltd., Akron Rubber produced by TOA-GOSEI Co., Ltd or the like.

There is no particular limitation on the thermosetting resin. However, epoxy resin or phenol resin is preferably used.

Examples of the epoxy resin include, e.g., difunctional or polyfunctional epoxy resin such as bisphenol type, phenol novolac type, cresol novolac type, glycidyl ether type, glycidyl ester type, glycidyl amine type, trihydroxyphenylmethane type, tetraglycidylphenolalkane type, naphthalene type, diglycidylphenylmethane type, diglycidyl biphenyl type or the like. Among them, bisphenol type epoxy resin is preferably used, and bisphenol A-type epoxy resin is more preferably used.

Further, examples of the phenol resin include novolak phenol resins such as alkylphenol resin, p-phenylphenol resin, bisphenol A type phenol resin or the like, and other known phenol resins such as resol phenol resin, polyphenyl-p-phenol resin or the like. Especially, novolak phenol resin is used preferably.

As for the thermosetting resin, these may be used alone, or at least two of these may be used in combination.

The content of the acrylic rubber and that of the thermosetting resin in the adhesive 14 are preferably same as those in the adhesive layer 22.

Besides, the adhesive layer 22 may contain an oxidation inhibitor, a filler and the like depending on purposes. The adhesive 14 contains the same. In the case of using the epoxy resin, the adhesive layer 22 may contain a hardening accelerator and a hardening agent for epoxy resin, if necessary. The adhesive 14 contains the same as well. For example, imidazoles, tertiary amines, phenols, dicyandiamides, aromatic diamines, organic peroxides or the like can be used.

The string-like adhesive 14 can be obtained by evenly coating on a surface of a release film an adhesive made of a material same as that of the adhesive forming the adhesive layer 22, semi-hardening the adhesive coated on the release film by heating, and then cutting the adhesive together with the release film in a stripe-shape or a spiral-shape.

Figure 5:
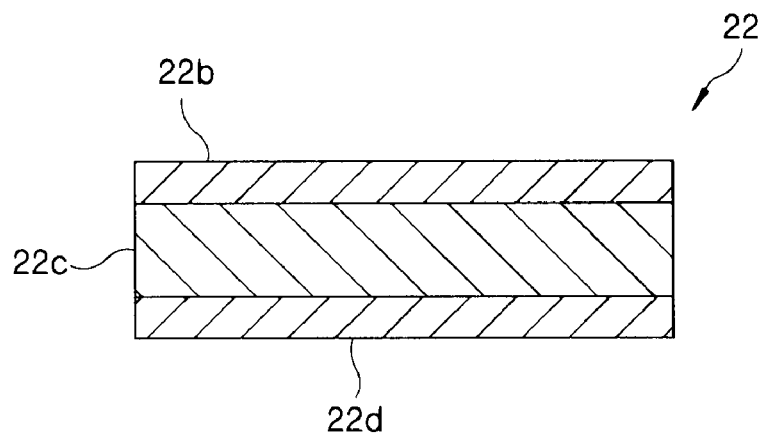
FIG. 5 represents a cross sectional view of an adhesive layer having a three-layer structure of the electrostatic chuck device.

In addition, in order to reduce stress and suppress plasma erosion, the adhesive layer 22 is preferably made to have a three-layer structure in which a first and a second adhesive layer 22b and 22d are formed on both sides of a stress relief layer 22c as shown in FIG. 5. In that case, it is further preferable to use the adhesive 14 having a three-layer structure in repairing, each layer being made of a material same as that of each layer of the adhesive layer 22.

The stress relief layer 22c is not particularly limited as long as it is a rubber-like elastic member containing acrylic rubber, and the material thereof can be properly selected depending on purposes. The acrylic rubber can be made of a material same as that of the above-described adhesive. The stress relief layer 22c may contain rubber other than silicon rubber in addition to the acrylic rubber. For example, butyl rubber, nitrile rubber, chloroprene rubber, urethane rubber, natural rubber or the like can be used.

Each of the first and the second adhesive layer 22b and 22d may be made of a material same as that of the above-described adhesive.

If the adhesive layer 22 has such a three-layer structure and the adhesive 14 having the same structure and component as those of the adhesive layer 22 is used, the adhesive 14 can be obtained by the following method, for example. A sheet as the first adhesive layer 22b is obtained by coating the first adhesive layer 22b on a release film and heating the coated first adhesive layer. In the same manner, sheets as the stress relief layer 22c and the second adhesive layer 22d are formed on respective release films. A three-layer structure sheet is obtained by sequentially laminating the sheet as the first adhesive layer 22b, the sheet as the stress relief layer 22c and the sheet as the second adhesive layer 22d after the respective release films of the stress relief layer 22c and the second adhesive layer 22d are removed. Thereafter, the three-layer structure sheet is cut together with the release film of the first adhesive layer 22b in a stripe-shape or a spiral-shape.

If the adhesive layer 22 has the above-described laminated structure, it is extremely difficult to obtain, by spinning, the string-like adhesive 14 having a completely same structure and component as those of the adhesive layer 22. Therefore, the adhesive 14 can preferably be obtained by using the three-layer structure sheet formed by semi-hardening an adhesive on a release film as described above. Accordingly, the adhesive 14 having the completely same structure and component as those of the adhesive layer 22 can be easily obtained.

A leading end 14a (FIG. 3) of the adhesive 14 can be adhered to the side surface 22a of the adhesive layer 22 by pressurizing the leading end 14a to the side surface 22 by using a jig or the like due to the adhesivity of the adhesive 14.

The cross sectional shape of the adhesive 14 is not particularly limited, but is preferably a rectangle. When the cross sectional shape is a rectangle, the eroded adhesive layer can be filled with the adhesive 14 without a gap.

Figure 6:
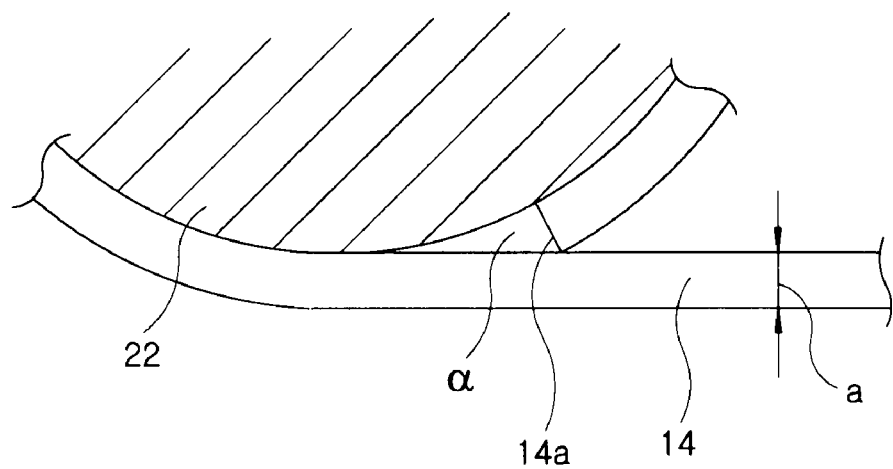
FIG. 6 offers a schematic top view depicting a state in which the adhesive layer is wound with a string-like adhesive.

A thickness "a" of the adhesive 14 (a length of the adhesive 14 in a radial direction of the adhesive layer 22 wound by the adhesive 14 shown in FIG. 6) is preferably smaller than or equal to about 1/10 of a length of an eroded portion of the adhesive layer 22 (a thickness that can be filled by winding the adhesive 14 at least ten times). By setting a ratio of a/b to be smaller than or equal to about 1/10, a gap is hardly generated when the adhesive layer 22 is wound with the adhesive 14. In other words, when the thickness "a" of the adhesive 14 is greater than 1/10 of the length "b", a gap α is easily generated at the leading end 14a of the adhesive 14 when second winding of the adhesive 14 on the adhesive layer 22 is conducted (shown in FIG. 6). As the thickness "a" of the adhesive 14 decreases, the adhesive 14 can be wound securely without generating the gap α.

A height "c" of the adhesive 14 (a length in a height direction (Z-axis direction) of the adhesive layer 22 shown in FIG. 3) is preferably the same or slightly greater than a height "d" of the adhesive layer 22 (shown in FIG. 3). More preferably, it is about 1 to 2 times greater, and further preferably about 1.05 to 1.15 times greater than the height "d". When the height "c" is about same or slightly greater than the height "d", the adhesive 14 need not be wound multiple times in a height direction of the adhesive layer 22 and, also, a generation of a gap can be prevented at a portion repaired by the adhesive 14 in the height direction of the adhesive layer 22. Hence, the uniform adhesive layer 22 can be easily obtained by repairing the eroded adhesive layer 22. Further, when the adhesive 14 is used while being tightened by the positioning device 13 in the repairing apparatus 10, the adhesive 14 is stretched and becomes thin. In that case, the repairing operation is performed by using a slightly thicker adhesive 14 as described above.

The height "d" of the adhesive layer 22 is generally about 100 μm, so that the height "c" of the adhesive 14 is preferably about 100 μm or slightly greater than about 100 μm (e.g., about 110 μm).

As will be described later, the repairing operation in the present invention is preferably performed when the adhesive layer 22 is eroded inward by about 1 to 10 mm from a circumference (an initial position of the side surface of the adhesive layer 22) of the attracting layer 23. The eroded side surface 22a of the adhesive layer 22 is wound at least ten times by the adhesive 14 having the thickness "a" that is about 1/10 of the eroded length "b" so that the eroded adhesive layer 22 can be completely repaired to be even with the circumference of the attracting layer 23.

For example, when the string-like adhesive 14 having a thickness "a" of, e.g., about 5 mm, is used to repair the adhesive layer 22 which is eroded inward from the circumference of the attracting layer 23 by about 6 mm (the length "b" being about 6 mm), a portion of the adhesive layer 22 positioned about 1 mm inward from the circumference of the attracting layer 23 is not repaired. However, in the case of using a string-like adhesive that is sufficiently thin compared to the eroded length "b" (small thickness "a"), the adhesive layer 22 can be uniformly repaired by multiply winding the string-like adhesive 14 to make the repaired adhesive layer 22 be even with the circumference of the attracting layer 23 without leaving an unrepaired portion.

The positioning device 13 performs positioning of the adhesive 14 between the bobbin 12 and the adhesive layer 22. In other words, the positioning device 13 can make position of the adhesive 14 coincide with the position of the adhesive layer 22 in the height direction (Z-axis direction), and also can tighten or relax the adhesive 14 as required.

For example, the position of the adhesive 14 in the Z-axis direction can be adjusted to coincide with the position of the adhesive layer 22 by making the adhesive 14 passing through the positioning device 13 and moving the positioning device 13 in the Z-axis direction. Moreover, the adhesive can be tightened or relaxed by moving the positioning device 13 in an X-axis direction, (shown FIG. 1). That is, the side surface 22a of the adhesive layer 22 can be firmly wound by properly tightening the adhesive 14.

[Repairing Method]

A repairing method for an electrostatic chuck of the present invention is used for an electrostatic chuck in which at least an adhesive layer and an attracting layer are provided on a metal base. The repairing method of the present invention is characterized in that the repairing operation is performed by winding a string-like adhesive around an eroded side surface of the adhesive layer and performing thermal compression.

Hereinafter, a method for repairing the adhesive layer 22 of the electrostatic chuck device 20 by using the above-described repairing apparatus 10 will be described as an example of the repairing method in accordance with an embodiment of the present invention.

The adhesive layer 22 of the electrostatic chuck device 20 has an exposed side surface to thereby be eroded by the plasma or the like (shown FIG. 2).

The repairing method of the present embodiment is performed when the exposed side surface of the adhesive layer 22 of the electrostatic chuck device 20 is eroded inward by about 1 to 10 mm from the circumference of the attracting layer 23 (when the length "b" is about 1 to 10 mm), and preferably when the eroded length "b" is smaller than about 5 mm in order to prevent generation of defects on the wafer by the erosion. If the eroded length "b" of the adhesive layer 22 is greater than about 10 mm, the thermal conductivity of the outermost peripheral portion of the wafer 24 (a portion corresponding to the eroded portion of the adhesive layer 22) deteriorates considerably. Hence, the etching state at the central portion of the wafer becomes different from that at the outermost peripheral portion thereof, and defects are easily generated on the wafer.

By performing the repairing operation especially when the eroded length "b" is smaller than about 5 mm, the generation of defects on the wafer by the erosion of the adhesive layer 22 can be prevented, and also it becomes easy to maintain the performance of the electrostatic chuck 20. Further, in the case where the electrostatic chuck device 20 has therein a unit for supplying cooling gas such as He or the like for cooling the wafer 24, a cooling gas outlet can also be easily prevented from being exposed.

In the repairing method of the present invention, first, the adhesive 14 supplied from the bobbin 12 is made to pass through the positioning device 13, and the leading end 14a of the adhesive 14 is made to adhere to the eroded side surface 22a of the adhesive layer 22 (shown in FIG. 3). Due to the adhesivity of the adhesive 14, the leading end 14a of the adhesive 14 can be made to adhere to the side surface 22a by pressurizing the adhesive 14 by inserting a jig between the metal base 21 and the attracting layer 23.

It is preferred that the adhesive 14 has the cross sectional shape, the thickness "a" and the height "c" same as those described above.

Moreover, in order to wind the adhesive 14 around the eroded portion of the adhesive layer 22, the position of the positioning device 13 is adjusted in advance, and the adhesive 14 is properly tightened. With such tightened adhesive 14, the eroded portion can be firmly wound and, further, the uniform adhesive layer 22 can be easily obtained after the repairing operation.

After sufficient adhesive 14 is wound around the side surface 22a of the adhesive layer 22 to thereby make the repaired adhesive layer 22 be even with the circumference of the attracting layer 23, the wound adhesive 14 and the adhesive layer 22 are thermally compressed to make them fuse into one. The conditions of the thermal compression are the same as those applied when the adhesive layer of the electrostatic chuck device is manufactured. Specifically, it is preferably performed under the condition of about 0.02 to 0.5 MPa.

By using the above-described method, the electrostatic chuck device 20 having an eroded adhesive layer 22 can be repaired.

[Electrostatic Chuck Device]

In the electrostatic chuck device to which the above-described repairing apparatus or repairing method is applied, a side surface of the adhesive layer is wound with a string-like adhesive. Since the electrostatic chuck device has a uniform adhesive layer, the heat of the wafer can be uniformly radiated from the metal base via the adhesive layer. Accordingly, desired etching process can be performed on the wafer.

In accordance with the aforementioned method and apparatus for repairing the electrostatic chuck device, the eroded adhesive layer can be uniformly repaired. Therefore, the thermal conductivity of the repaired adhesive layer is uniform even after the repairing operation, and defects are not generated on the wafer. This ensures a long life span of the electrostatic chuck device.

The method for repairing an electrostatic chuck of the present invention is not limited to a method using the repairing apparatus 10 shown in FIG. 1. Further, the repairing apparatus may not have the positioning device 13. Although FIGS. 1 to 3 describe the repairing operation of the electrostatic chuck device 20, the object to be repaired is not limited thereto, and may be various electrostatic chuck devices, as long as each of which has an eroded adhesive layer.

The method for repairing an electrostatic chuck device of the present invention is very effective in uniformly repairing an eroded adhesive layer. Therefore, the adhesive layer and the attracting layer can be repaired without being replaced unlike in a prior art.

While the invention has been shown and described with respect to the embodiments, it will be understood by those skilled in the art that various changes and modification may be made without departing from the scope of the invention as defined in the following claims.

What is claimed is:

1. A repairing method for an electrostatic chuck device in which at least an adhesive layer and an attracting layer are provided on a metal base, wherein a side surface of an eroded adhesive layer is wound with a string-like adhesive and thermal compression is performed thereafter.

2. The repairing method for an electrostatic chuck device of claim 1, wherein the string-like adhesive is made of a material same as a material of the adhesive layer.

3. The repairing method for an electrostatic chuck device of claim 1, wherein the adhesive layer and the string-like adhesive contain acrylic rubber and thermosetting resin.

4. The repairing method for an electrostatic chuck device of claim 1, wherein the string-like adhesive has a rectangular cross section.

5. The repairing method for an electrostatic chuck device of claim 1, wherein a height of the string-like adhesive is about 1 to 2 times greater than a height of the adhesive layer.

6. The repairing method for an electrostatic chuck device of claim 1, wherein the thermal compression is performed under the condition of about 0.02 to 0.5 MPa.

7. The repairing method for an electrostatic chuck device of claim 1, further comprising:
   rotating the electrostatic chuck device and supplying the adhesive to the adhesive layer from a bobbin.

8. The repairing method for an electrostatic chuck device of claim 7, further comprising positioning the adhesive between the bobbin and the adhesive layer.

9. The repairing method for an electrostatic chuck device of claim 1 wherein the string-like adhesive is provided to the side surface of the adhesive layer based on an amount of said erosion.

* * * * *